United States Patent
Cheng et al.

(10) Patent No.: US 10,199,464 B2
(45) Date of Patent: Feb. 5, 2019

(54) TECHNIQUES FOR VFET TOP SOURCE/DRAIN EPITAXY

(71) Applicant: International Business Machines Corporation, Armonk, NY (US)

(72) Inventors: Kangguo Cheng, Schenectady, NY (US); Cheng Chi, Jersey City, NJ (US); Chi-Chun Liu, Altamont, NY (US); Ruilong Xie, Schenectady, NY (US); Tenko Yamashita, Schenectady, NY (US); Chun-Chen Yeh, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/438,114

(22) Filed: Feb. 21, 2017

(65) Prior Publication Data

US 2018/0240873 A1 Aug. 23, 2018

(51) Int. Cl.
*H01L 29/08* (2006.01)
*H01L 29/78* (2006.01)
*H01L 29/66* (2006.01)

(52) U.S. Cl.
CPC ...... *H01L 29/0847* (2013.01); *H01L 29/6656* (2013.01); *H01L 29/66666* (2013.01); *H01L 29/7827* (2013.01)

(58) Field of Classification Search
CPC ............ H01L 29/0847; H01L 29/6656; H01L 29/7827; H01L 29/66666; H01L 27/2454; H01L 29/66712–29/66734; H01L 29/7802–29/7815; H01L 29/36–29/365; H01L 26/7853–29/7854; H01L 29/66803;

(Continued)

(56) References Cited

U.S. PATENT DOCUMENTS 5,006,909 A 4/1991 Kosa
5,073,519 A 12/1991 Rodder
(Continued)

FOREIGN PATENT DOCUMENTS

KR 101120181 B1 2/2012

OTHER PUBLICATIONS

English Translation of KR101120181B1 by Kim, Hyun Jung, dated Feb. 27, 2012 (11 pages).

*Primary Examiner* — Moazzam Hossain
*Assistant Examiner* — Stanetta Isaac
(74) *Attorney, Agent, or Firm* — Vazken Alexanian; Michael J. Chang, LLC

(57) ABSTRACT

Techniques for VFET top source and drain epitaxy are provided. In one aspect, a method of forming a VFET includes: patterning a fin to form a bottom source/drain region and a fin channel of the VFET; forming bottom spacers on the bottom source/drain region; depositing a high-κ gate dielectric onto the bottom spacers and along sidewalls of the fin channel; forming gates over the bottom spacers; forming top spacers on the gates; partially recessing the fin channel to create a trench between the top spacers; forming a nitride liner along sidewalls of the trench; fully recessing the fin channel through the trench such that side portions of the fin channel remain intact; and forming a doped epitaxial top source and drain region over the fin channel. Methods not requiring a nitride liner and VFET formed using the present techniques are also provided.

16 Claims, 11 Drawing Sheets

(58) Field of Classification Search
CPC ............... H01L 51/057; H01L 21/8224; H01L 21/28114
See application file for complete search history.

(56) References Cited

U.S. PATENT DOCUMENTS

| | | |
|---|---|---|
| 5,087,581 A | 2/1992 | Rodder |
| 5,504,359 A | 4/1996 | Rodder |
| 6,383,864 B2 | 5/2002 | Scheller et al. |
| 6,436,770 B1 | 8/2002 | Leung et al. |
| 6,696,713 B2 | 2/2004 | Ishibashi |
| 7,202,523 B2 | 4/2007 | Forbes |
| 7,795,620 B2 | 9/2010 | Huang |
| 7,915,669 B2 | 3/2011 | Forbes |
| 8,183,625 B2 | 5/2012 | Forbes |
| 8,188,552 B2 | 5/2012 | Huang |
| 9,368,572 B1 * | 6/2016 | Cheng ................ H01L 29/7827 |

\* cited by examiner

US 10,199,464 B2

TECHNIQUES FOR VFET TOP SOURCE/DRAIN EPITAXY

FIELD OF THE INVENTION

The present invention relates to vertical field effect transistor (VFET) devices, and more particularly, to methods and structures for VFET top source and drain epitaxy.

BACKGROUND OF THE INVENTION

With their reduced footprint, vertical field effect transistors or VFETs are being explored as a device option for scaling beyond the 7 nanometer (nm) technology node. VFETs generally include a fin that forms a vertical channel of the transistor, with source and drain regions situated at a top and bottom of the channel. A gate(s) is/are situated along the sidewalls of the fin channel.

There are, however, notable challenges associated with VFETs fabrication. In particular, forming good junction overlap of the top source and drain terminal to the gate can be difficult due to thinning of the high-κ gate dielectric and hence reliability issues. An alternative is to underlap the junction. However, underlapping the junction significantly increases the external resistance, and thus degrades performance of the transistor.

Accordingly, improved techniques for forming the top source and drain junction of vertical transistors would be desirable.

SUMMARY OF THE INVENTION

The present invention provides methods and structures for vertical field effect transistor (VFET) top source and drain epitaxy. In one aspect of the invention, a method of forming a VFET is provided. The method includes the steps of: patterning a fin in a stack having a doped epitaxial layer disposed on a substrate, and an intrinsic layer disposed on the doped epitaxial layer, wherein the doped epitaxial layer as patterned forms a bottom source and drain region of the VFET, and wherein the intrinsic layer as patterned forms a fin channel of the VFET; forming bottom spacers on the bottom source and drain region on opposite sides of the fin channel; depositing a high-κ gate dielectric onto the bottom spacers and along sidewalls of the fin channel; forming gates over the bottom spacers on opposite sides of the fin channel, wherein the gates are separated from the fin channel by the high-κ gate dielectric; forming top spacers on the gates on opposite sides of the fin channel; partially recessing the fin channel to create a trench between the top spacers; forming a nitride liner along sidewalls of the trench; fully recessing the fin channel through the trench, wherein the nitride liner reduces a width of the trench such that side portions of the fin channel remain intact during the fully recessing that cover the high-κ gate dielectric; and forming a doped epitaxial top source and drain region in the trench over the fin channel.

In another aspect of the invention, another method of forming a VFET is provided. The method includes the steps of: patterning a fin in a stack having a doped epitaxial layer disposed on a substrate, and an intrinsic layer disposed on the doped epitaxial layer, wherein the doped epitaxial layer as patterned forms a bottom source and drain region of the VFET, and wherein the intrinsic layer as patterned forms a fin channel of the VFET; forming bottom spacers on the bottom source and drain region on opposite sides of the fin channel; depositing a high-κ gate dielectric onto the bottom spacers and along sidewalls of the fin channel; forming gates over the bottom spacers on opposite sides of the fin channel, wherein the gates are separated from the fin channel by the high-κ gate dielectric; forming top spacers i) on the gates on opposite sides of the fin channel, and ii) over the fin channel; thinning a region of the fin channel between the top spacers; depositing a filler dielectric surrounding the bottom spacers, the fin channel, the gates and the high-κ gate dielectric, and the top spacers; removing the top spacer from over the fin channel forming a trench in the filler dielectric; recessing the fin channel through the trench, wherein the trench has a width that is greater than a width of the thinned region of the fin channel such that side portions of the fin channel remain intact during the recessing that cover the high-κ gate dielectric; and forming a doped epitaxial top source and drain region in the trench over the fin channel.

In yet another aspect of the invention, a VFET is provided. The VFET includes: a doped epitaxial bottom source and drain region; a fin channel disposed on the doped epitaxial bottom source and drain region; bottom spacers disposed on the bottom source and drain region on opposite sides of the fin channel; a high-κ gate dielectric disposed on the bottom spacers and along sidewalls of the fin channel; gates over the bottom spacers on opposite sides of the fin channel, wherein the gates are separated from the fin channel by the high-κ gate dielectric, wherein a center portion of the fin channel is recessed below a top of the gates, and wherein side portions of the fin channel are un-recessed and remain intact covering the high-κ gate dielectric; top spacers disposed on the gates on opposite sides of the fin channel; and a doped epitaxial top source and drain region in the trench over the fin channel.

A more complete understanding of the present invention, as well as further features and advantages of the present invention, will be obtained by reference to the following detailed description and drawings.

DETAILED DESCRIPTION OF PREFERRED EMBODIMENTS

Figure 1:
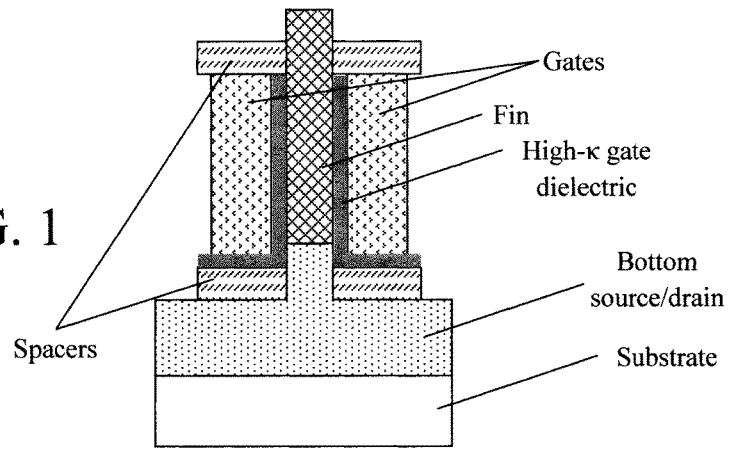
FIG. 1 is a cross-sectional diagram illustrating an exemplary vertical field effect transistor (VFET) prior to top source/drain formation.

Vertical field effect transistors (VFETs) generally include a fin that forms a vertical channel of the transistor, with source/drain regions situated at a top and bottom of the channel, and gates situated along the sidewalls of the fin channel. See FIG. 1 which depicts an exemplary VFET prior to forming the top source/drain region. As shown in FIG. 1, a high-κ gate dielectric separates the gates from the fin. The term "high-κ" as used herein refers to a material having a relative dielectric constant κ which is much higher than that of silicon dioxide (e.g., a dielectric constant κ=25 for hafnium oxide (HfO$_2$) rather than 4 for silicon dioxide). Spacers offset the gates (vertically) from the bottom and top (to be formed) source/drain regions.

Figure 2:
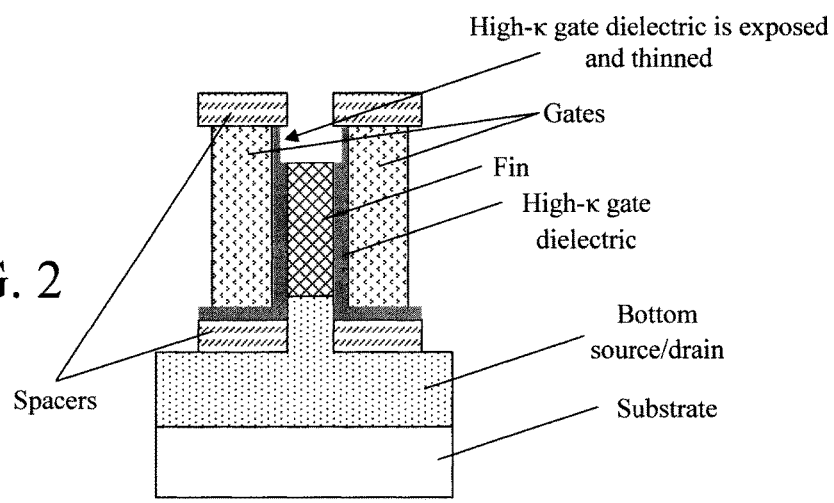
FIG. 2 is a cross-sectional diagram illustrating a deep recess of the fin having been performed.
Figure 3:
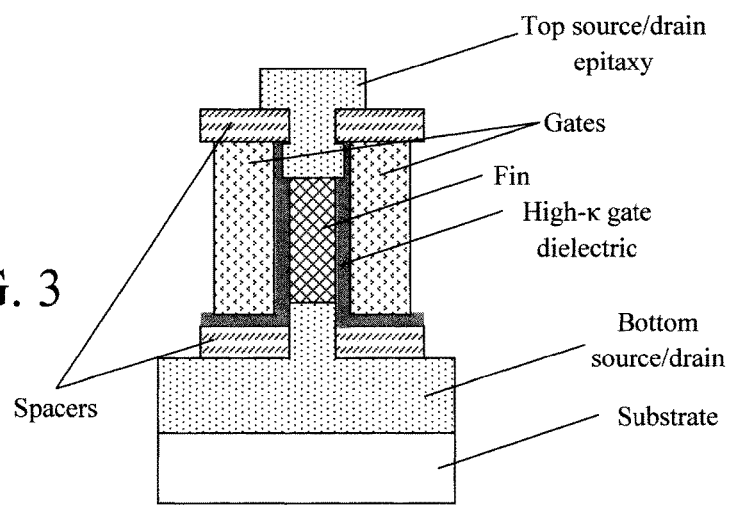
FIG. 3 is a cross-sectional diagram illustrating an (in-situ) doped epitaxy having been performed to form the top source/drain.

As provided above, VFET fabrication can present some notable challenges. For instance, forming good junction overlap of the top source and drain terminal to the gate can be difficult to achieve. One approach can be to employ a deep recess of the fin to ensure an overlap junction. This can however result in high-κ reliability and tool contamination issues. See, for example, FIGS. 2 and 3. Namely, the fin is recessed below the top of the high-κ gate dielectric (see FIG. 2), followed by an (in-situ) doped epitaxy (see FIG. 3). However, exposing the high-κ gate dielectric to the epitaxy process causes potential thinning of the high-κ gate dielectric (which leads to reliability concerns) and contamination of the epitaxy tool, both of which are undesirable.

Figure 4:
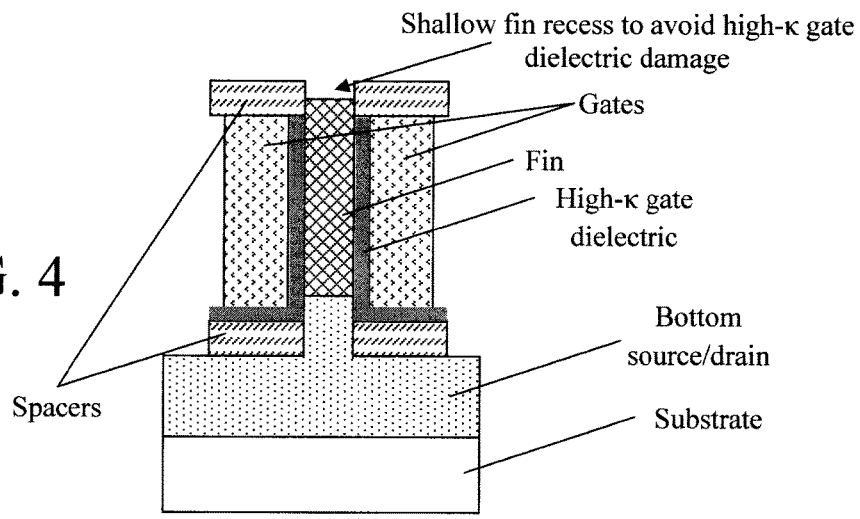
FIG. 4 is a cross-sectional diagram illustrating the fin having been recessed so that the fin remains above the high-κ gate dielectric.
Figure 5:
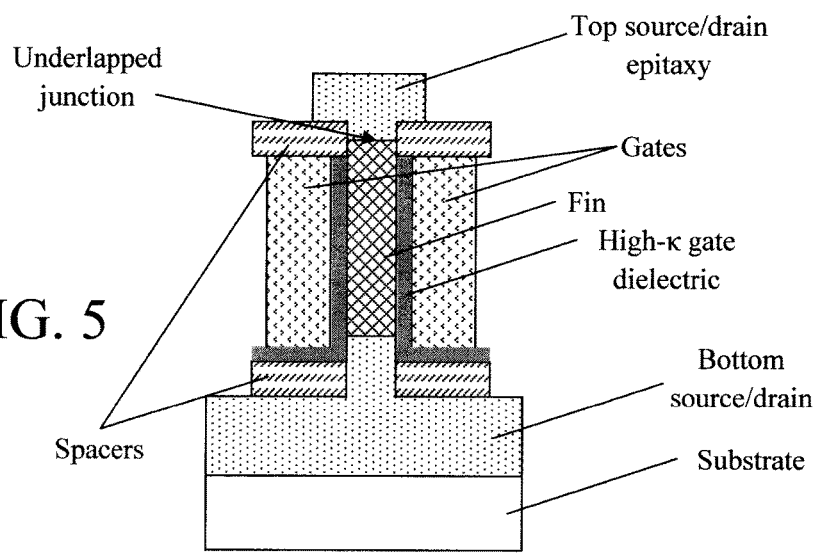
FIG. 5 is a cross-sectional diagram illustrating an (in-situ) doped epitaxy having been performed to form the top source/drain which underlaps the gates.

An alternative approach might be to underlap the junction. This however results in degraded device performance. See, for example, FIGS. 4 and 5. Namely, if the recessed fin top is above the high-κ gate dielectric, i.e., the high-κ gate dielectric remains sealed (see FIG. 4), then there is no high-κ gate dielectric reliability/contamination concerns. However, in this case, after epitaxy the top source/drain junction is underlapped (see FIG. 5). Underlapped junctions are undesirable as they significantly increase the external resistance and thus degrade the transistor performance.

Advantageously, provided herein are techniques for forming the top source/drain regions of a VFET wherein the high-κ gate dielectric remains fully protected (covered) without having to underlap the junction with the gates. To begin the process, a fin is formed in a wafer. See FIGS. 6 and 7. For illustrative purposes only, the process shown illustrates use of bulk semiconductor wafer (e.g., bulk silicon (Si), germanium (Ge), silicon germanium (SiGe), etc. wafer) as a starting platform. However, the same process can be applied to use of a silicon-on-insulator (SOI) wafer and/or to a semiconductor-on-insulator wafer (i.e., wherein the SOI layer is something other than Si, such as Ge, SiGe, etc.). As is known in the art, a SOI wafer includes a substrate (e.g., Si, Ge, SiGe, etc.), a buried insulator disposed on the substrate, and a SOI layer disposed on the buried insulator. When the buried insulator is an oxide, it is also referred to as a buried oxide or BOX. Techniques for fabricating a VFET starting with an SOI wafer are detailed, for example, in U.S. Pat. No. 9,368,572 issued to Cheng et al., entitled "Vertical Transistor with Air-Gap Spacer," the contents of which are incorporated by reference as if fully set forth herein.

Figure 6:
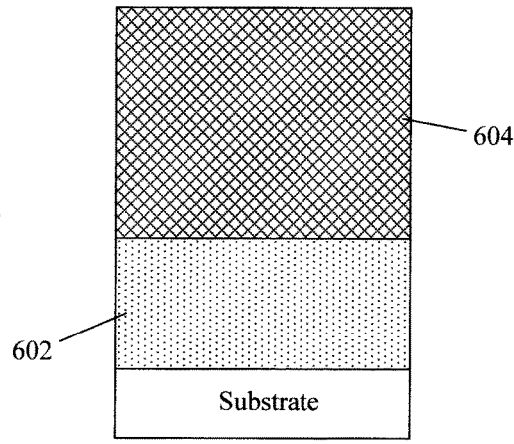
FIG. 6 is a cross-sectional diagram illustrating a doped epitaxial layer having been formed on a substrate, and an intrinsic layer having been formed on the doped epitaxial layer according to an embodiment of the present invention.

As shown in FIG. 6, a doped epitaxial layer 602 is formed on the substrate. This doped epitaxial layer 602 will serve as the basis for forming the bottom source/drain of the VFET. Doping can be performed in-situ or ex-situ. By in-situ it is meant that dopants are introduced during epitaxial growth of layer 602. Ex-situ doping involves introducing the dopants (e.g., via ion implantation) following epitaxial growth of the layer 602. The composition of layer 602 and the dopants vary depending on the type of VFET being formed. By way of example only, for a p-channel FET (p-FET) a suitable composition for layer 602 is boron (B) doped SiGe, whereas for an n-channel FET (n-FET) a suitable composition for layer 602 is phosphorous (P) doped silicon carbide (SiC).

An intrinsic layer 604 is formed on the doped epitaxial layer 602. Again, an epitaxial process may be employed, however dopants are not introduced into intrinsic layer 604. Intrinsic layer 604 will serve as the basis for forming the fin channel of the VFET. The substrate, doped epitaxial layer 602, and intrinsic layer 604 form a stack of device layers in which the VFET will be formed.

Figure 7:
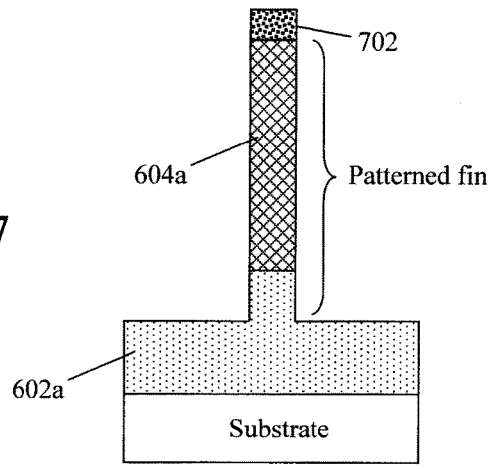
FIG. 7 is a cross-sectional diagram illustrating a patterned fin hardmask having been used to pattern a fin extending through the intrinsic layer and partway through the doped epitaxial layer according to an embodiment of the present invention.

Namely, as shown in FIG. 7, a patterned fin hardmask 702 is formed on the stack (i.e., on the intrinsic layer 604), and standard lithography and etching techniques are used via the patterned fin hardmask 702 to form a fin extending through the intrinsic layer 604 and through a portion of (i.e., part-way through) the doped epitaxial layer 602. According to an exemplary embodiment, the patterned fin mask 702 is formed from a nitride material, such as silicon nitride (SiN). Simply endpointing the etch before the doped epitaxial layer 602 is fully removed can be used to achieve this configuration. As highlighted above, the patterned doped epitaxial layer 602 will serve as the bottom source/drain region of the VFET, and thus will be referred to hereinafter as bottom source/drain 602a. The patterned intrinsic layer 604 will serve as the fin channel of the VFET, and thus will be referred to hereinafter as fin channel 604a.

It is notable that the illustration of a single fin is done solely for ease and clarify of depiction. It is to be understood that the present techniques may be employed, in the same manner described, to form multiple fins/VFETs in a common wafer.

Bottom spacers 802 are then formed on the bottom source/drain 602a on opposite sides of the fin channel 604a. See FIG. 8. Bottom spacers 802 can be formed by depositing a suitable spacer material over the bottom source/drain 602a, and then patterning the spacer material into the individual bottom spacers 802. Suitable spacer materials include, but are not limited to, oxides such as silicon oxide (SiO$_2$), nitrides such as silicon nitride (SiN), and/or low-K materials such as carbon-doped oxide materials containing silicon (Si), carbon (C), oxygen (O), and hydrogen (H) (SiCOH) or siliconborocarbonitride (SiBCN). The term "low-κ" as used herein refers to a material having a relative dielectric constant κ which is lower than that of silicon nitride.

A high-κ (gate) dielectric 804 is then deposited onto the bottom spacers 802 and along the sidewalls of the fin channel 604a. A conformal deposition process, such as chemical vapor deposition (CVD) or atomic layer deposition (ALD) may be employed to deposit the high-κ dielectric 804. Suitable high-κ dielectrics include, but are not limited to, hafnium oxide (HfO$_2$) and lanthanum oxide (La$_2$O$_3$).

Gates 806 are then formed over the bottom spacers 802 on opposite side of the fin channel 604a. Gates 806 are separated from the fin channel 604a by the high-κ dielectric 804, and gates 806 are offset from the bottom source/drain 602a by the bottom spacers 802. According to an exemplary embodiment, the gates 806 contain a metal or combination of metals. For instance, gates 806 can be formed by depositing a conformal workfunction setting metal layer onto the high-κ dielectric 804 (using, e.g., CVD or ALD), followed by a low resistance, filler gate metal deposited onto the workfunction setting metal layer. See, for example, FIG. 8. The particular workfunction setting metal used can vary depending on whether an n-type or p-type transistor is desired. For instance, suitable n-type workfunction metals include, but are not limited to, titanium nitride (TiN), tantalum nitride (TaN), and aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and tantalum aluminum carbide (TaAlC). Suitable p-type workfunction metals include, but are not limited to, TiN, TaN, and tungsten (W). Suitable low resistance gate metals include, but are not limited to tungsten (W) and/or aluminum (Al).

Figure 9:
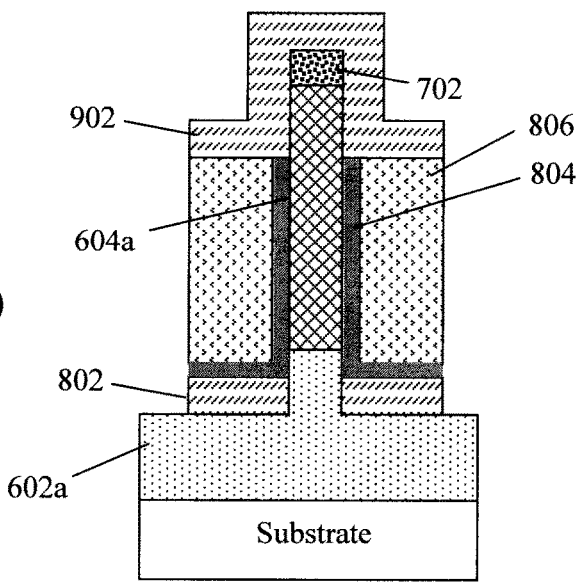
FIG. 9 is a cross-sectional diagram illustrating a top spacer material having been deposited on top of the gates and the fin channel according to an embodiment of the present invention.

Next, a top spacer material 902 is deposited on top of the gates 806 and the fin channel 604a (i.e., over the patterned fin hardmask 702). See FIG. 9. Suitable spacer materials include, but are not limited to, oxides such as SiO$_2$, nitrides such as SiN, and/or low-κ materials such as SiCOH or SiBCN. As shown in FIG. 9, the top spacer material 902 seals the high-κ dielectric 804.

Figure 10:
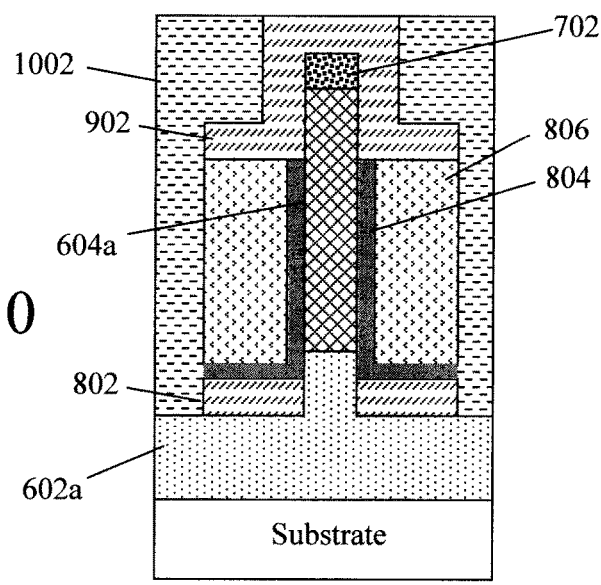
FIG. 10 is a cross-sectional diagram illustrating the structure having been surrounded with a filler dielectric which is then polished back to expose the top spacer above the fin channel according to an embodiment of the present invention.

The structure is then surrounded with a filler dielectric 1002 which is then polished back (i.e., recessed) to expose the top spacer material 902 above the fin channel 604a. See FIG. 10. Suitable dielectrics include, but are not limited to, SiO$_2$ and low-κ inter-layer dielectrics (ILDs) such as SiCOH or SiBCN. As shown in FIG. 10, filler dielectric 1002 as deposited surrounds the bottom spacers 802, fin channel 604a, gates 806 (and high-κ dielectric 804) and top spacer material 902. Polishing back filler dielectric 1002 can be achieved using a process such as chemical mechanical polishing or CMP.

Figure 11:
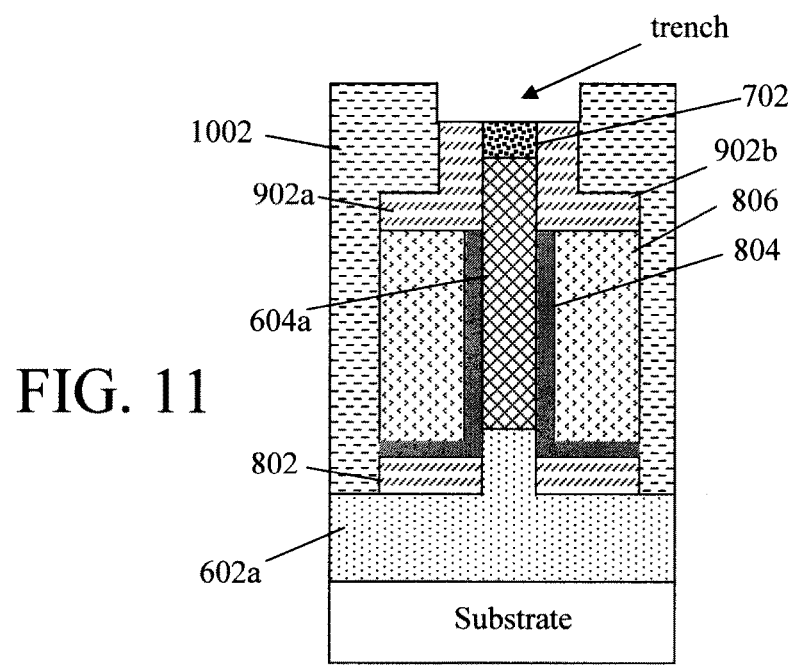
FIG. 11 is a cross-sectional diagram illustrating the top spacer material having been recessed to expose the underlying patterned fin hardmask, thereby dividing the top spacer material into two top spacers according to an embodiment of the present invention.

The filler dielectric 1002 is polished back in order to enable access to the underlying top spacer material 902 a portion of which is then recessed to expose the underlying patterned fin hardmask 702. See FIG. 11. This removal of a portion of the top spacer material 902 over the fin channel 604a divides the (single) top spacer material 902 into two individual top spacers, one on each side of the fin channel 604a which will hereinafter be given reference numerals 902a and 902b. A selective etching process is used to recess the top spacer material 902 with respect to the filler dielectric 1002. Employing different materials for the top spacer material 902 and the filler dielectric 1002 enables etch selectivity between these layers. By way of example only, a nitride material such as SiBCN can be employed for the top spacer material 902 and an oxide material for the filler dielectric 1002.

Figure 12:
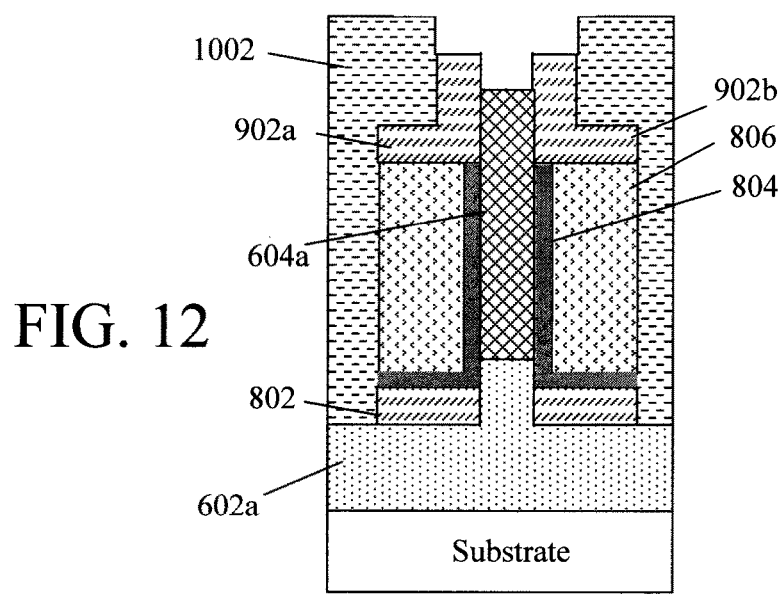
FIG. 12 is a cross-sectional diagram illustrating the patterned fin hardmask having been removed selective to the top spacer according to an embodiment of the present invention.

Now exposed, the patterned fin hardmask 702 is removed selective to the top spacers 902a and 902b. See FIG. 12. Again, employing different materials for the patterned fin hardmask 702 and the top spacers 902a and 902b enables etch selectivity between these layers. By way of example only, SiN can be employed for the patterned fin hardmask 702 and SiBCN can be employed for the top spacers 902a and 902b.

Figure 13:
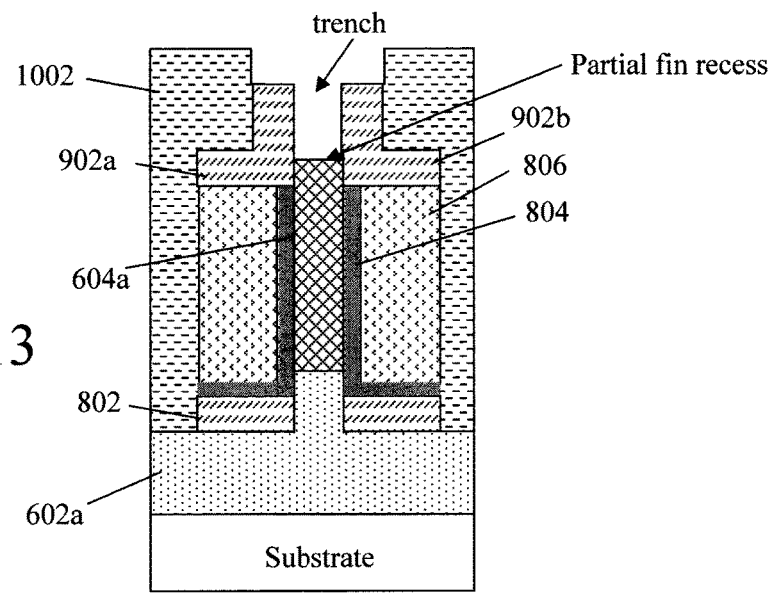
FIG. 13 is a cross-sectional diagram illustrating a partial recess etch of the fin channel having been performed according to an embodiment of the present invention.

Removal of the patterned fin hardmask 702 is necessary to permit recessing of the fin channel 604a. See FIG. 13. In this example, a partial fin recess is performed, meaning that (as shown in FIG. 13) the fin channel 604a recess does not extend far enough to expose the high-κ dielectric 804 (i.e., the top of the recessed fin channel 604a is still between the top spacers 902a and 902b). The extent of the fin recess can be controlled by endpointing the etch once the desired partial recess has been achieved. In this manner, the high-κ dielectric 804 still remains covered (i.e., unexposed) preventing any reliability or contamination issues (see above). The partial fin recess creates a trench between the top spacers 902a and 902b.

Figure 14:
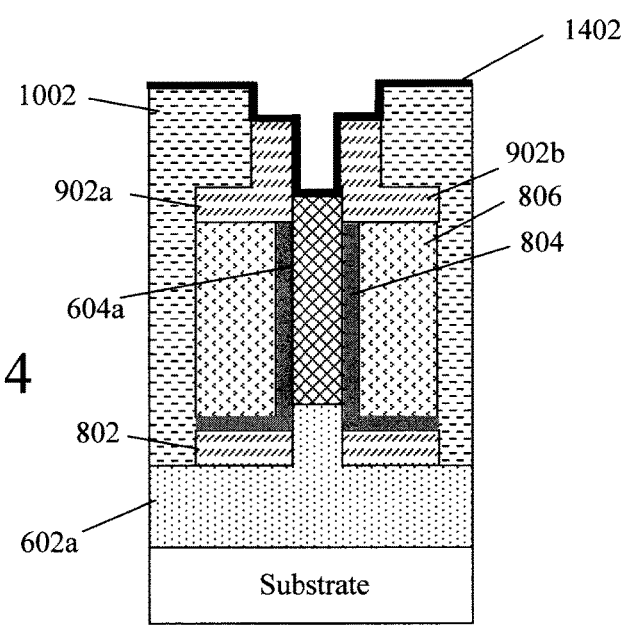
FIG. 14 is a cross-sectional diagram illustrating a thin nitride liner having been deposited onto the dielectric, covering the top spacer and partially recessed fin channel according to an embodiment of the present invention.

A thin nitride liner 1402 is then deposited onto the filler dielectric 1002, covering the top spacers 902a and 902b, and lining (bottom and sidewalls of) the trench. See FIG. 14. According to an exemplary embodiment, the nitride liner 1402 has a thickness of from about 5 nanometer (nm) to about 10 nm, and ranges therebetween (e.g., about 6 nm), and is deposited using an in-situ radical assisted deposition (iRad) tool available, for example, from Tokyo Electron Laboratory (TEL), Austin Tex. As shown in FIG. 14, nitride liner 1402 covers both vertical and horizontal surfaces of the filler dielectric 1002, top spacers 902a and 902b and the trench. The next task is to remove the nitride liner 1402 from the horizontal surfaces (including from the bottom of the trench). The goal here is to create a thin mask (via the nitride liner 1402) over the sidewalls of the fin channel 604a, which will enable the fin recess to be completed without exposing the underlying high-κ dielectric 804.

Figure 15:
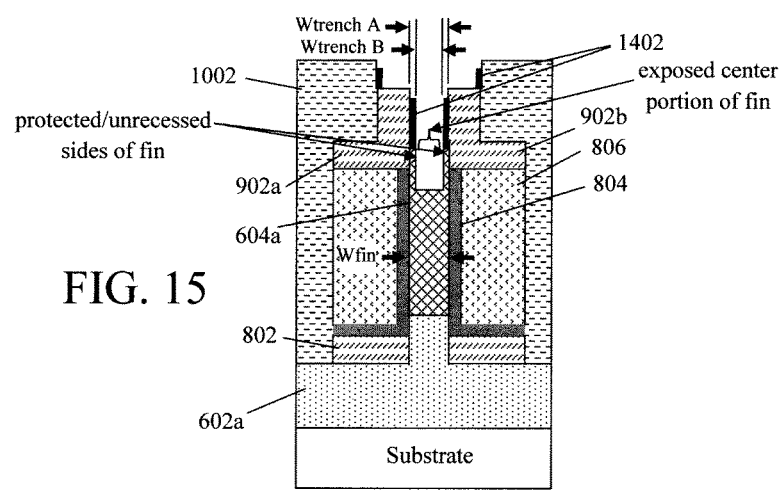
FIG. 15 is a cross-sectional diagram illustrating a directional etch back of the nitride liner having been performed, which removes the nitride liner from horizontal surfaces including over a center portion of the partially recessed fin channel, and the fin recess etch having been completed whereby the vertical portions of the nitride liner that remain over the sidewalls of the fin channel prevent the fin recess etch from removing the protected sidewalls of the fin channel (and thus prevent exposure of the underlying high-κ dielectric) according to an embodiment of the present invention.

Namely, as shown in FIG. 15 a directional etch back of the nitride liner 1402 is performed, which removes the nitride liner 1402 from all horizontal surfaces including over a center portion of the partially recessed fin channel 604a. An isotropic etching process, such as a nitride-selective reactive ion etching (RIE) process, is suitable. As a result, vertical portions of the nitride liner 1402 remain along the sidewalls of the trench and over the sidewalls of the partially recessed fin channel 604a. See FIG. 15. The formation of the nitride liner 1402 along the sidewalls of the trench essentially narrows the width of the trench as well as an opening at the bottom of the trench through which the fin recess etch will be completed (e.g., from Wtrench A to Wtrench B) to be less than a width of fin the channel 604a (Wfin), i.e., Wtrench B<Wfin.

Next, with the etched-back nitride liner 1402 in place along the vertical sidewalls of the trench, the fin recess etch is completed (through the narrowed trench) whereby the fin channel 604a is recessed below (a top of) the gates 802. The narrowed trench with the vertical portions of the nitride liner 1402 prevent the fin recess etch from removing the sides of the fin channel 604a, i.e., only an exposed center portion of the fin channel 604a is removed, and thus these side portions of the fin channel 604a remain intact. As a result, the high-κ dielectric 804 remains covered (by the unrecessed sides of the fin channel 604a) during the entire fin recessing process thereby avoiding altogether any reliability or contamination issues from an exposed high-κ. Based on the selectivity of the fin recess etch, some of the remaining nitride liner 1402 might be removed. However, the protected sides of the fin channel 604a that remain unrecessed are generally commensurate in thickness with the thickness of the nitride liner 1402, i.e., having a thickness Tsidewall1 of from about 5 nm to about 10 nm, and ranges therebetween (e.g., about 6 nm).

Figure 16:
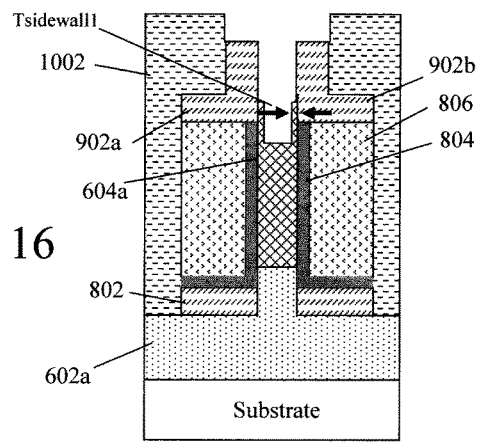
FIG. 16 is a cross-sectional diagram illustrating the remaining nitride liner having been removed according to an embodiment of the present invention.

Any remaining nitride liner 1402 is then removed, e.g., using a nitride-selective etching process. See FIG. 16. An epitaxial doped top source/drain region 1702 is then formed within the trench on top of the (fully) recessed fin channel 604a. See FIG. 17. As with the bottom source/drain of the VFET, doping for the top source/drain region 1702 can be performed in-situ and ex-situ, and the composition of top source/drain region 1702 and the dopants can vary depending on the type of VFET being formed. By way of example only, for a p-FET, top source/drain region 1702 can include boron-doped SiGe, whereas for an n-FET, top source/drain region 1702 can include phosphorous-doped SiC.

An anneal is then performed to diffuse the dopants from the epitaxial doped top source/drain region 1702 into the intact side portions of the fin channel 604a to form the junction. However, since these intact side portions of the fin channel 604a are very thin (e.g., from about 5 nm to about 10 nm, and ranges therebetween (e.g., about 6 nm)—see above), there is no need for a high thermal budget diffusion anneal. For example, a laser anneal at a temperature of from about 1000° C. to about 1300° C., and ranges therebetween, may be employed.

Figure 17:
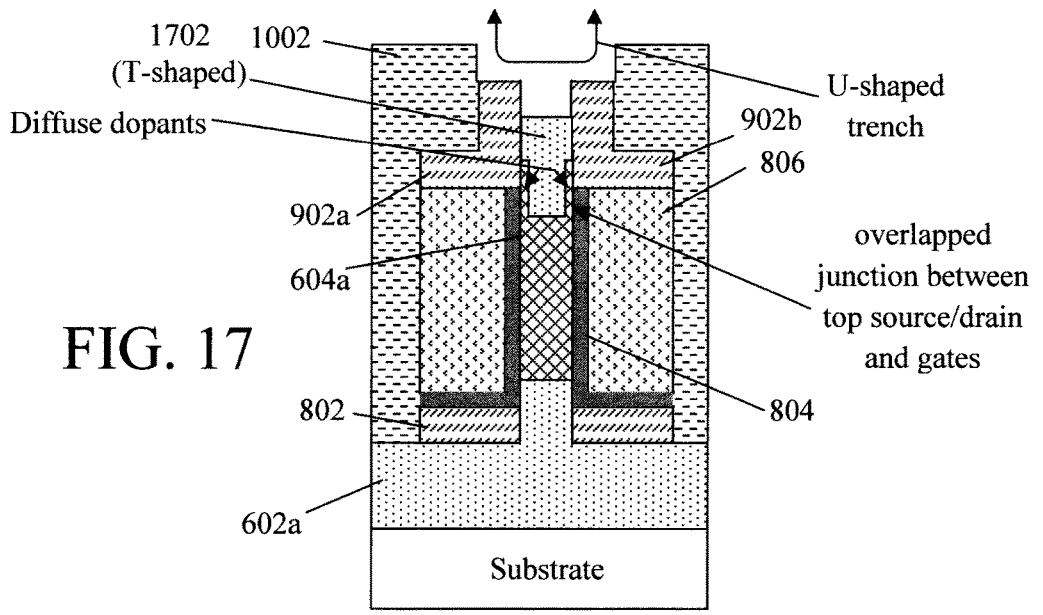
FIG. 17 is a cross-sectional diagram illustrating a doped epitaxial top source/drain region having been formed on top of the (fully) recessed fin channel according to an embodiment of the present invention.

As illustrated in FIG. 17, the present VFET device structure in this example has some distinctive notable features. For instance, there is a u-shaped recess in the filler dielectric 1002. See FIG. 17. Specifically, based on the etch-back of top spacer 902 following deposition of the filler dielectric 1002, there is a U-shaped recess in the dielectric. At the center of this U-shaped recess is the recessed fin channel 604a. Another notable feature illustrated in FIG. 17 is that while an overlapping junction is formed between the top source/drain region 1702 and the gates 802, the high-κ dielectric 804 remains fully protected by the sidewalls of the fin channel 604a. This feature results in a unique profile of the top source/drain region 1702. Specifically, due to the two-step fin recess process with the nitride liner 1402 placed after the partial fin recess, the epitaxy top source/drain region 1702 formed in the recess is wider at the top, than at the bottom (i.e., T-shaped).

Another exemplary process flow is also provided herein whereby the high-κ dielectric remains fully covered while still permitting an overlapped junction to be formed. This alternative process flow is now described by way of reference to FIGS. 18-24.

Figure 8:
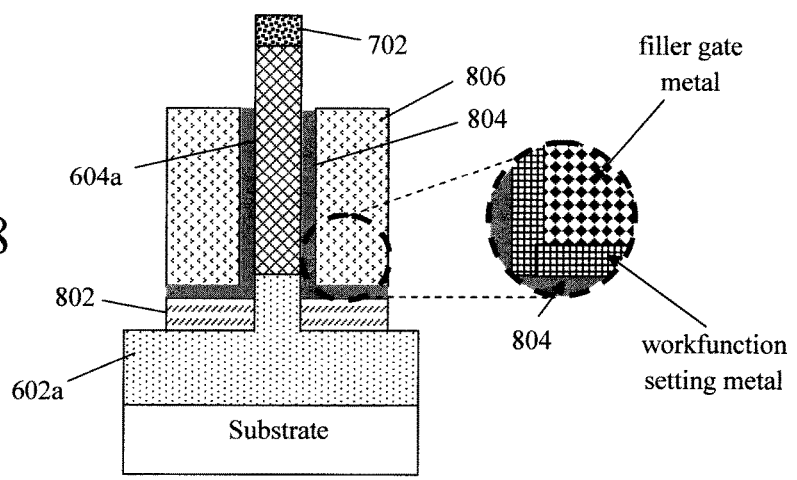
FIG. 8 is a cross-sectional diagram illustrating bottom spacers having been formed on the bottom source/drain on opposite sides of the fin channel, a high-κ dielectric having been deposited onto the bottom spacers and along the sidewalls of the fin channel, and gates having been formed over the bottom spacers on opposite sides of the fin channel according to an embodiment of the present invention.

The initial steps are the same as the exemplary process flow described in accordance with the description of FIGS. 6-8, above. Accordingly, the same structures are numbered alike throughout the figures. As described above, a doped epitaxial layer 602 is formed on a substrate, and an intrinsic layer 604 is formed on the doped epitaxial layer 602 (see FIG. 6). A patterned fin hardmask 702 is then used to pattern a fin extending through the intrinsic layer and partway through the doped epitaxial layer 602 (see FIG. 7). The patterned doped epitaxial layer 602 will serve as the bottom source/drain region of the VFET, and thus will be referred to hereinafter as bottom source/drain 602a. The patterned intrinsic layer 604 will serve as the fin channel of the VFET, and thus will be referred to hereinafter as fin channel 604a. Bottom spacers 802 are formed on the bottom source/drain 602a on opposite sides of the fin channel 604a, a high-κ dielectric 804 is deposited onto the bottom spacers 802 and along the sidewalls of the fin channel 604a, and gates 806 are formed over the bottom spacers 802 on opposite side of the fin channel 604a (see FIG. 8).

Figure 18:
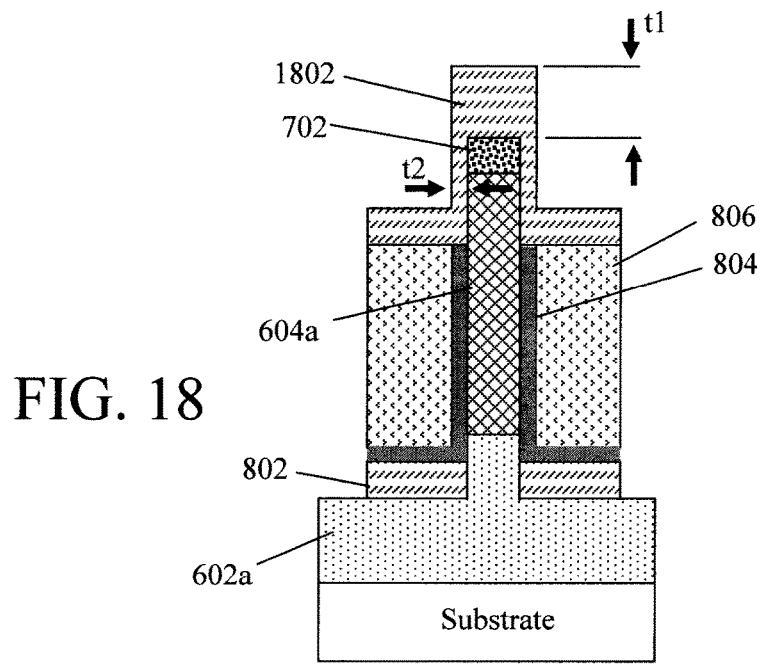
FIG. 18 is a cross-sectional diagram illustrating, according to an alternative embodiment, a (non-conformal) top spacer material having been formed on top of the gates and the fin channel according to an embodiment of the present invention.

Referring now to FIG. 18 (which follows from FIG. 8), a top spacer material 1802 is next deposited on top of the gates 806 and the fin channel 604a (i.e., over the patterned fin hardmask 702). As above, suitable spacer materials include, but are not limited to, oxides such as $SiO_2$, nitrides such as SiN, and/or low-κ materials such as SiCOH or SiBCN. As shown in FIG. 18, the top spacer material 1802 seals the high-κ dielectric 804. However, by comparison with top spacer 902 in the example above, top spacer material 1802 is formed using a non-conformal deposition process, such as an angled physical vapor deposition (PVD) process. As a result, a thickness t1 of the top spacer material 1802 on horizontal surfaces (such as on top of the gates 806 and the fin channel 604a) is greater than a thickness t2 of the top spacer material 1802 on vertical surfaces (such as along the sidewalls of the fin channel 604a), i.e., t1>t2. See FIG. 18. Employing a non-conformal top spacer ensures that, after the top spacer material 1802 is removed from the vertical surfaces using an isotropic etching etch back process (see below), portions of the top spacer material 1802 will remain on top of the gates 806 and the fin channel 604a.

Figure 19:
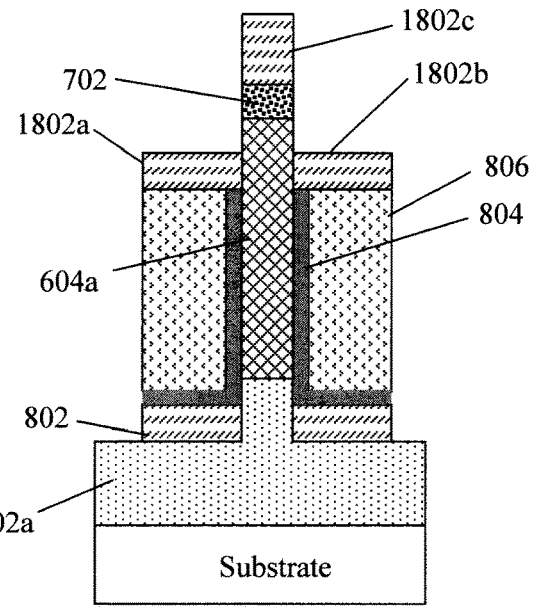
FIG. 19 is a cross-sectional diagram illustrating the top spacer material having been etched back forming individual top spacers on the gates and above the fin channel, and exposing the sidewalls of the fin channel according to an embodiment of the present invention.

Namely, as shown in FIG. 19, the top spacer material 1802 is then etched back, removing the top spacer material 1802 from the vertical surfaces, including from along the sidewalls of the fin channel 604a which are now exposed. A nitride-selective isotropic etching process can be employed in order to access the top spacer material 1802 along the fin channel sidewalls. Following the etch back, portions of the top spacer material 1802 remain on top of the gates 806 and the fin channel 604a. This is a result of the top spacer material 1802 initially being thicker in those regions. These portions of the top spacer material 1802 that remain on top of the gates 806 serve as individual top spacers, one on each side of the fin channel 604a and will hereinafter be given reference numerals 1802a and 1802b. The portion of the top spacer material 1802 that remains on top of the fin channel 604a will hereinafter be given reference numeral 1802c.

Figure 20:
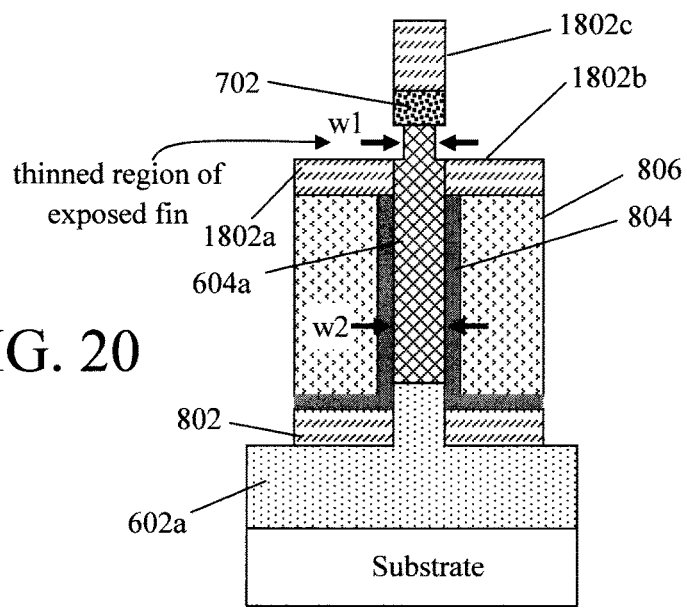
FIG. 20 is a cross-sectional diagram illustrating the exposed sidewalls of the fin channel having been recessed according to an embodiment of the present invention.

As above, the goal here is to keep the high-κ dielectric 804 sealed during fin recess and top source/drain epitaxy. A portion of the sidewall of the fin channel 604a remains covering the high-κ dielectric 804. Above, this was accomplished by placing an intermediate nitride liner. In this example, prior to surrounding the structure in a dielectric, and with the patterned fin hardmask 702 in place, the exposed sidewalls of the fin channel 604a are recessed. See FIG. 20. This serves to thin the exposed region of the fin channel between the top spacers 1802a/1802b and 1802c. As shown in FIG. 20, post-recessing, the exposed sidewalls of the fin channel 604a have a width w1 and the unexposed sidewalls of the fin channel 604a have a width w2, wherein w1<w2.

According to an exemplary embodiment, the fin sidewall recess etch is carried out using plasma oxidation, whereby an oxygen plasma is used to oxidize a surface layer of the exposed fin sidewall (forming, e.g., a surface layer of $SiO_2$) which can then be stripped to reveal a thinner fin. This oxidation and oxide stripping process can be repeated multiple times until the recessed fin of a desired thickness (i.e., w1) is achieved. Alternatively, an isotropic wet etching process can be employed.

Figure 21:
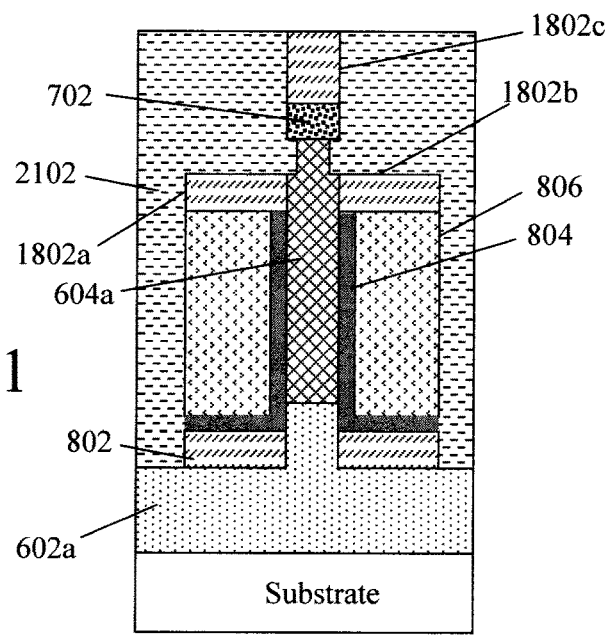
FIG. 21 is a cross-sectional diagram illustrating the structure having been surrounded with a filler dielectric which is then polished back to expose the top spacer above the fin channel according to an embodiment of the present invention.

The structure is then surrounded with a filler dielectric 2102 which is then polished back (i.e., recessed) to expose the top spacer 1802c above the fin channel 604a. See FIG. 21. As above, suitable dielectrics include, but are not limited to, $SiO_2$ and low-κ ILDs such as SiCOH or SiBCN. As shown in FIG. 21, filler dielectric 2102 as deposited surrounds the bottom spacers 802, gates 806 (and high-κ dielectric 804) and top spacers 1802a, 1802b, and 1802c. Polishing back filler dielectric 2102 can be achieved using a process such as CMP.

The filler dielectric 2102 is polished back in order to enable access to the underlying top spacer 1802c which in turn is also removed from over the fin channel 604a to expose the underlying patterned fin hardmask 702. The exposed patterned fin hardmask 702 is then removed from over the fin channel 604a. See FIG. 22. As provided above, a selective etching step, or series of selective etching steps can be employed to remove the top spacer 1802c and patterned fin hardmask 702 selective to the filler dielectric 2102.

Figure 22:
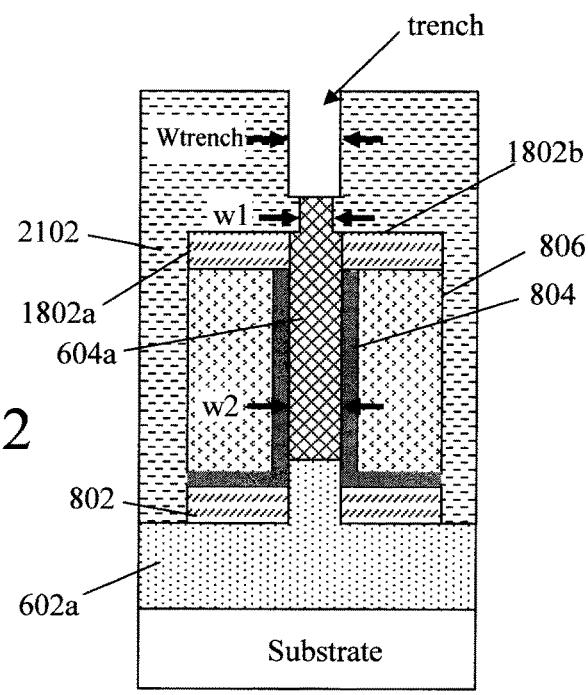
FIG. 22 is a cross-sectional diagram illustrating the top spacer above the fin channel and the patterned fin hardmask having been removed from over the fin channel according to an embodiment of the present invention.

It is notable that, as shown in FIG. 22, a trench is formed in the filler dielectric 2102 as a result of the removal of the top spacer 1802c and patterned fin hardmask 702 from over the fin channel 604a. The width of that trench Wtrench is greater than the width w1 of the thinned region of the fin channel 604a beneath the trench, i.e., Wtrench>w1 and Wtrench≈w2. Based on this 'hourglass-shaped' configuration, when the fin channel 604a is recessed for the top source drain (through the trench), the filler dielectric 2102 surrounding the thinned region of the fin channel 604a will act as a mask preventing complete removal of the fin below the gates 806. Specifically, a protected portion of the fin sidewalls will remain covering the high-κ dielectric 804. That way an overlapping top source/drain and gate junction can be formed without contamination or reliability issues associated with exposed high-κ. In the example above, the nitride liner served to protect the fin sidewall during fin recess, here it is the filler dielectric 2102.

Figure 23:
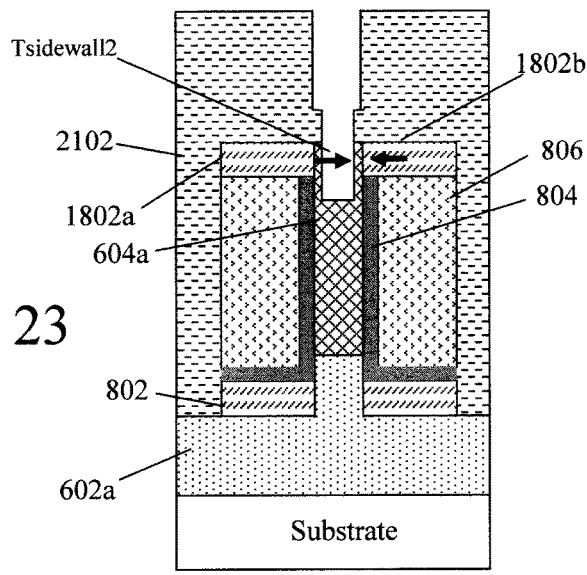
FIG. 23 is a cross-sectional diagram illustrating a full fin recess having been performed whereby a center portion of the fin channel is recessed below the tops of the gates, while a protected sidewall portion of the fin channel remains covering the high-κ dielectric according to an embodiment of the present invention.

By comparison with the above example, a full fin recess is performed here in a single step (i.e., through the trench) whereby a top, center portion of the fin channel 604a is recessed below the tops of the gates 806. See FIG. 23. As shown in FIG. 23, the filler dielectric 2102 that had surrounded the recessed sidewall portion of the fin channel 604a protects a portion of the fin sidewall, thereby preventing these protected side portions from being removed during the recess etch. As a result, the high-κ dielectric 804 remains covered during the fin recessing process thereby avoiding altogether any reliability or contamination issues from an exposed high-κ. According to an exemplary embodiment, the protected side portions of the fin channel 604a that remain intact have a thickness Tsidewall2 of from about 5 nm to about 10 nm, and ranges therebetween (e.g., about 6 nm)—which represents the difference between w1 and w2, i.e., w2−w1=Tsidewall2—see FIG. 22.

An epitaxial doped top source/drain region 2402 is then formed in the trench on top of the recessed fin channel 604a. See FIG. 24. As with the bottom source/drain of the VFET, doping for the top source/drain region 2402 can be performed in-situ or ex-situ, and the composition of top source/drain region 2402 and the dopants can vary depending on the type of VFET being formed. By way of example only, for a p-FET, top source/drain region 2402 can include boron-doped SiGe, whereas for an n-FET, top source/drain region 2402 can include phosphorous-doped SiC.

An anneal is then performed to diffuse the dopants from the epitaxial doped top source/drain region 2402 into the protected sidewalls of the fin channel 604a to form the junction. However, since these protected sidewalls of the fin channel 604a are very thin (e.g., from about 5 nm to about 10 nm, and ranges therebetween (e.g., about 6 nm)—see above), there is no need for a high thermal budget diffusion anneal. For example, a laser anneal at a temperature of from about 1000° C. to about 1300° C., and ranges therebetween, may be employed.

Figure 24:
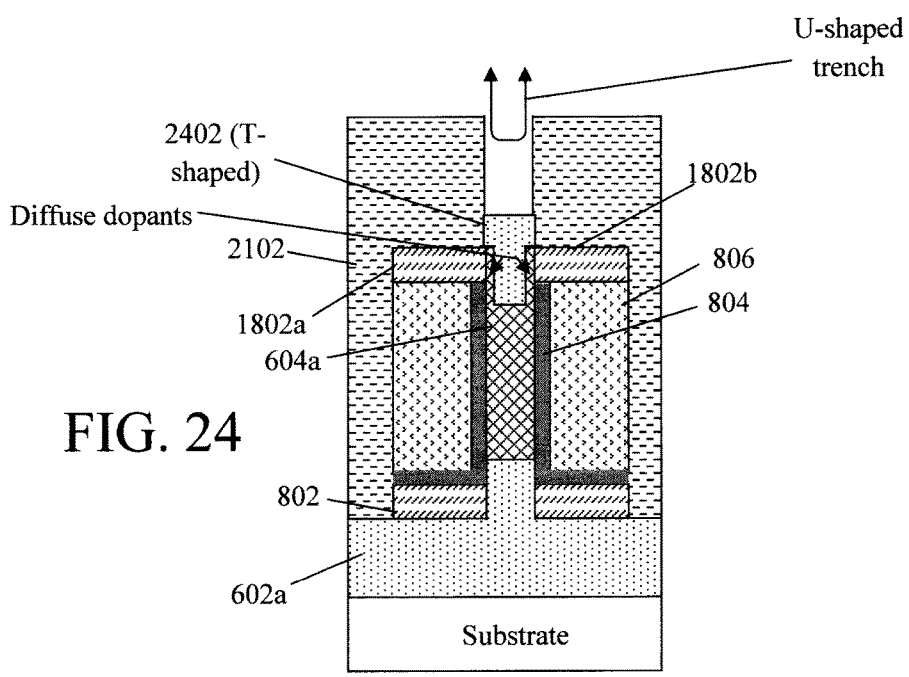
FIG. 24 is a cross-sectional diagram illustrating an epitaxial doped top source/drain region having been formed in the trench on top of the recessed fin channel according to an embodiment of the present invention.

As illustrated in FIG. 24, the present VFET device structure in this example has some distinctive notable features. For instance, there is a U-shaped recess in the filler dielectric 2102. At the center of this U-shaped recess is the recessed fin channel 604a. Another notable feature is that while an overlapping junction is formed between the top source/drain region 2402 and the gates 806, the high-κ dielectric 804 remains fully protected by the sidewalls of the fin channel 604*a*. This feature results in a unique profile of the top source/drain region 2402. Specifically, due to the fin sidewall etch, followed by deposition of the filler dielectric 2102 and full fin recess, the epitaxy top source/drain region 2402 formed in the trench is wider at the top, than at the bottom (i.e., T-shaped).

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a vertical field-effect transistor (VFET), comprising the steps of:
    patterning a fin in a stack comprising a doped epitaxial layer disposed on a substrate, and an intrinsic layer disposed on the doped epitaxial layer, wherein the doped epitaxial layer as patterned forms a bottom source and drain region of the VFET, and wherein the intrinsic layer as patterned forms a fin channel of the VFET;
    forming bottom spacers on the bottom source and drain region on opposite sides of the fin channel;
    depositing a high-κ gate dielectric onto the bottom spacers and along sidewalls of the fin channel;
    forming gates over the bottom spacers on opposite sides of the fin channel, wherein the gates are separated from the fin channel by the high-κ gate dielectric;
    forming top spacers on the gates on opposite sides of the fin channel;
    partially recessing the fin channel to create a trench between the top spacers;
    forming a nitride liner along sidewalls of the trench;
    fully recessing the fin channel through the trench by removing a center portion of the fin channel, wherein the nitride liner reduces a width of the trench to prevent side portions of the fin channel from being removed such that the side portions of the fin channel remain intact during the fully recessing and cover the high-κ gate dielectric; and
    forming a doped epitaxial top source and drain region in the trench over the fin channel, wherein the doped epitaxial top source and drain region is T-shaped.

2. The method of claim 1, further comprising the steps of:
    forming a patterned fin hardmask on the stack; and
    using the patterned fin hardmask to pattern the fin in the stack.

3. The method of claim 2, further comprising the steps of:
    depositing a spacer material on top of the gates and the patterned fin hardmask;
    depositing a filler dielectric surrounding the bottom spacers, the fin channel, the gates and the high-κ gate dielectric, and the spacer material;
    recessing the filler dielectric;
    removing the spacer material from over the fin channel to form the top spacers on opposite sides of the fin channel; and
    removing the patterned fin mask.

4. The method of claim 1, wherein during the partially recessing of the fin channel, a top of the fin channel remains between the top spacers.

5. The method of claim 1, wherein the nitride liner reduces a width of the trench to be less than a width of the fin channel.

6. The method of claim 1, wherein during the fully recessing of the fin channel, the center portion of the fin channel is recessed below a top of the gates.

7. The method of claim 1, wherein the side portions of the fin channel that remain intact fully covering the high-κ gate dielectric have a thickness of from about 5 nm to about 10 nm, and ranges therebetween.

8. The method of claim 1, further comprising the step of:
    annealing the doped epitaxial top source and drain region to diffuse dopants from the doped epitaxial top source and drain region into the side portions of the fin channel covering the high-κ gate dielectric.

9. The method of claim 1, wherein the step of forming the nitride liner along the sidewalls of the trench includes the steps of:
    depositing the nitride liner into and lining a bottom and the sidewalls of the trench; and
    removing the nitride liner from horizontal surfaces including the bottom of the trench.

10. A method of forming a VFET, comprising the steps of:
    patterning a fin in a stack comprising a doped epitaxial layer disposed on a substrate, and an intrinsic layer disposed on the doped epitaxial layer, wherein the doped epitaxial layer as patterned forms a bottom source and drain region of the VFET, and wherein the intrinsic layer as patterned forms a fin channel of the VFET;
    forming bottom spacers on the bottom source and drain region on opposite sides of the fin channel;
    depositing a high-κ gate dielectric onto the bottom spacers and along sidewalls of the fin channel;
    forming gates over the bottom spacers on opposite sides of the fin channel, wherein the gates are separated from the fin channel by the high-κ gate dielectric;
    forming top spacers i) on the gates on opposite sides of the fin channel, and ii) over the fin channel;
    thinning a region of the fin channel between the top spacers;
    depositing a filler dielectric surrounding the bottom spacers, the fin channel, the gates and the high-κ gate dielectric, and the top spacers;
    removing the top spacer from over the fin channel forming a trench in the filler dielectric;
    recessing the fin channel through the trench by recessing a center portion of the fin channel, wherein the trench has a width that is greater than a width of the thinned region of the fin channel, and wherein the filler dielectric surrounding the region of the fin channel that is thinned prevents side portions of the fin channel from being recessed such that the side portions of the fin channel remain intact during the recessing and cover the high-κ gate dielectric; and
    forming a doped epitaxial top source and drain region in the trench over the fin channel, wherein the doped epitaxial top source and drain region is T-shaped.

11. The method of claim 10, further comprising the steps of:
    forming a patterned fin hardmask on the stack; and
    using the patterned fin hardmask to pattern the fin in the stack.

12. The method of claim 11, further comprising the steps of:
    depositing a spacer material over of the gates and the fin channel; and removing the spacer material from the sidewalls of the fin channel.

13. The method of claim 12, further comprising the step of:

depositing the spacer material as a non-conformal layer over the gates and the fin channel, wherein the spacer material on top of the gates and the fin channel has a thickness t1 and the spacer material on the sidewalls of the fin channel has a thickness t2, and wherein t1>t2.

14. The method of claim 11, further comprising the step of:

removing the patterned fin hardmask from over the fin channel prior to the recessing.

15. The method of claim 10, wherein during the recessing of the fin channel, the center portion of the fin channel is recessed below a top of the gates.

16. The method of claim 10, further comprising the step of:

annealing the doped epitaxial top source and drain region to diffuse dopants from the doped epitaxial top source and drain region into the side portions of the fin channel covering the high-κ gate dielectric.

* * * * *